United States Patent [19]

Owen et al.

[11] Patent Number: 5,378,158

[45] Date of Patent: Jan. 3, 1995

[54] LIGHT EMITTING DIODE AND SOCKET ASSEMBLY

[75] Inventors: Marvin L. Owen; Mark J. Miller, both of Grand Blanc, Mich.

[73] Assignee: Delco Electronics Corporation, Kokomo, Ind.

[21] Appl. No.: 183,705

[22] Filed: Jan. 21, 1994

[51] Int. Cl.[6] .............................................. H01R 13/66
[52] U.S. Cl. ...................................... 439/57; 439/620; 439/931
[58] Field of Search ......................... 439/931, 56–58, 439/620, 547

[56] References Cited

U.S. PATENT DOCUMENTS

| | | | |
|---|---|---|---|
| 4,934,951 | 6/1990 | Schonath | 439/57 |
| 5,078,079 | 1/1992 | Ohta et al. | 439/931 |
| 5,246,386 | 9/1993 | Nanjo | 439/931 |

*Primary Examiner*—Gary F. Paumen
*Attorney, Agent, or Firm*—Jimmy L. Funke

[57] ABSTRACT

A twist-in socket for insertion into a printed circuit assembly has a molded plastic body, conductive paths deposited or plated onto the surface, and an LED and a resistor connected to the paths for energization by the printed circuit. The sockets are molded in arrays, plated to form the conductive paths, the components inserted by automatic machines and flow soldered to the paths, and then individual sockets are snapped off the array. In one embodiment, the LED and resistor have leads extending through holes in the socket to reach the conductive paths. In another embodiment, surface mount components are used, and plated-through holes in the socket couple the path to the surface mount components.

4 Claims, 2 Drawing Sheets

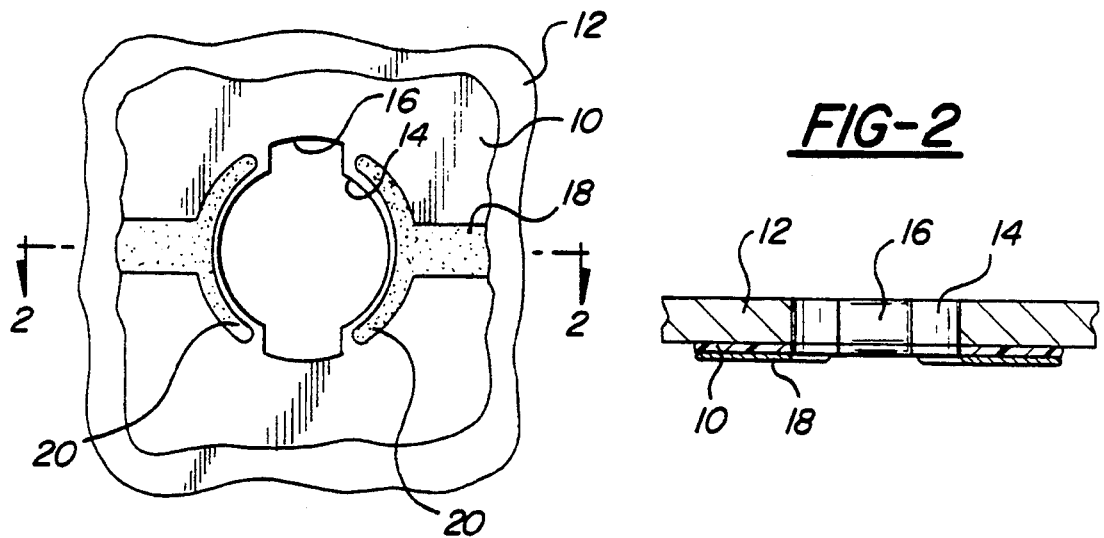
*FIG-2*
*FIG-1*
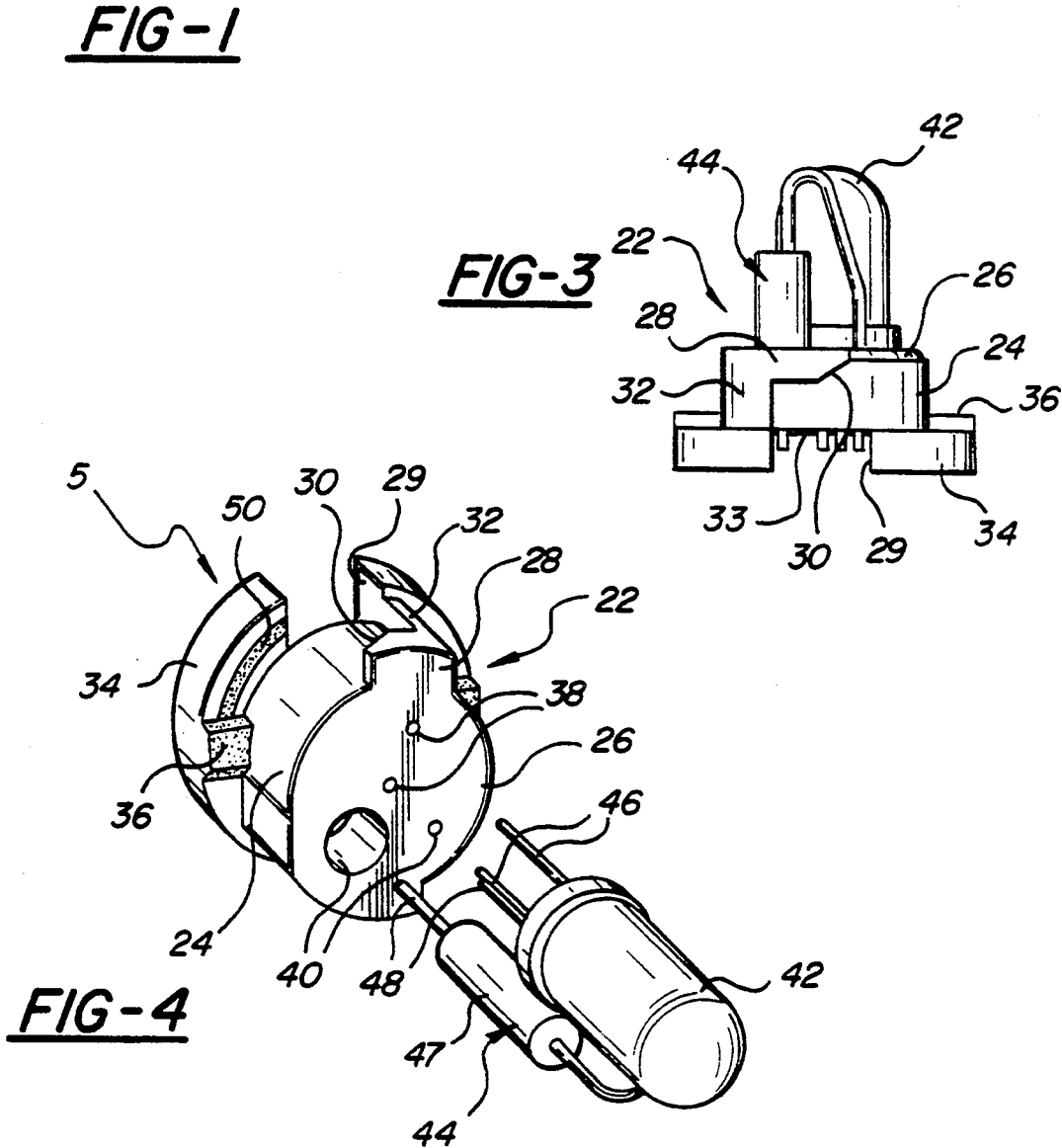
*FIG-3*
*FIG-4*

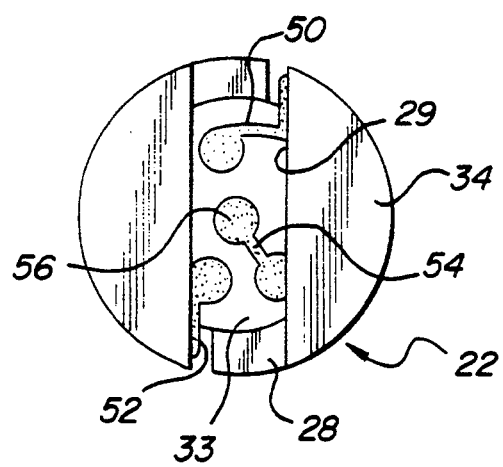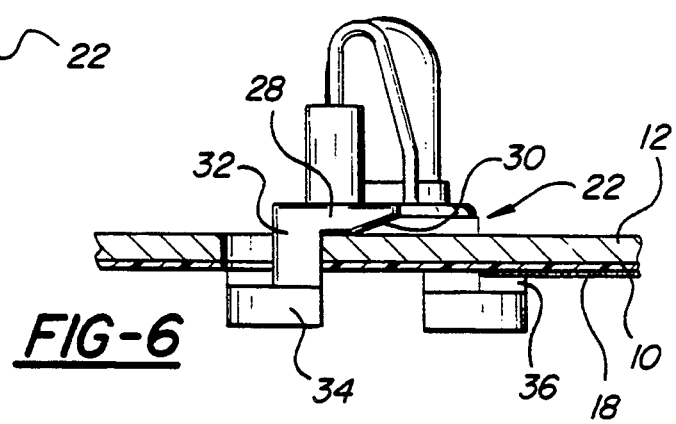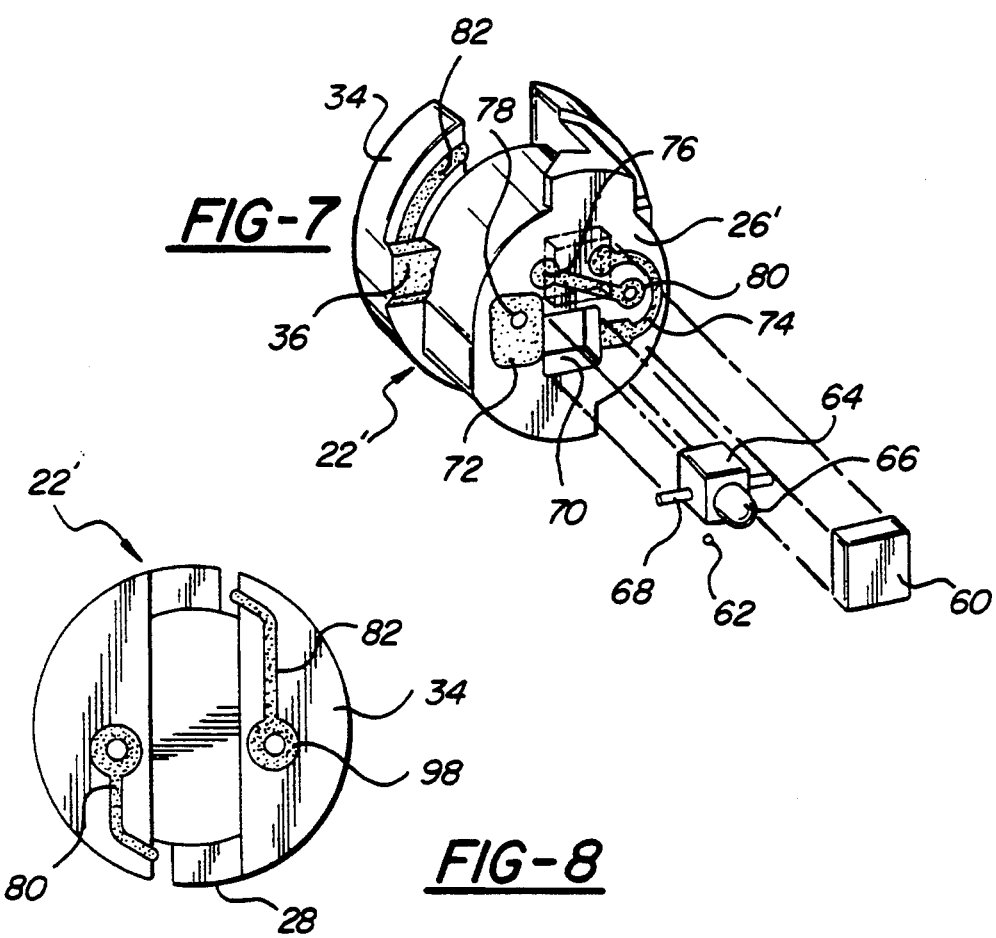

LIGHT EMITTING DIODE AND SOCKET ASSEMBLY

FIELD OF THE INVENTION

This invention relates to apparatus for illuminating instrument clusters and particularly to sockets containing light emitting diodes for easy insertion in printed circuit assemblies.

BACKGROUND OF THE INVENTION

Automotive instrument clusters utilize a large number of telltale lamps for indicating conditions existing throughout the vehicle. In some applications twenty or more lamps are used. Miniature incandescent lamps are generally used for this purpose.

Due to demand for increased reliability in the automotive industry, manufacturers are tending to replace the incandescent lamps with electronic devices such as light emitting diodes (LEDs). LEDs usually require a resistor in series to limit current through the device; the limited current generates very little heat. The LEDs and their resistors are easily mounted to conventional hardboard printed circuits with ordinary handling equipment. On the other hand, mounting these devices to typical flexible printed circuits is more involved, more expensive, and creates a difficult service procedure.

SUMMARY OF THE INVENTION

It is therefore an object of the invention to facilitate the assembly of LEDs to printed circuit assemblies, especially those using flexible circuits. Another object is to allow quick replacement of LEDs for servicing purposes.

The invention is carried out by incorporating LEDs and their associated resistors in lamp sockets which are assembled to the printed circuit of an instrument cluster by inserting into an aperture and twisting, in the same manner as has been done with incandescent lamps. Each socket is a miniature printed circuit; a molded plastic base configured as a twist-in socket is plated with conductive pathways, and has provision for mounting an LED and a resistor. The fabrication of the LED socket assemblies is also like printed circuit processes. The molded plastic sockets are molded in arrays of many parts, conductive patterns are applied by copper plating to form both contacts and circuit paths, the sockets are stuffed with LEDs and resistors by conventional assembly equipment, the whole array is flow soldered, and then finished individual LED socket parts are snapped from the array. Axial lead LEDs and resistors are used in the assembly using holes formed in the socket body to receive the leads. The resistor body may be incorporated into such a hole. Alternatively, surface mount components are used. In that case, plated through holes in the body bring the conductive paths to the surface for joining to the LED and the resistor.

BRIEF DESCRIPTION OF THE DRAWINGS

The above and other advantages of the invention will become more apparent from the following description taken in conjunction with the accompanying drawings wherein like references refer to like parts and wherein:

FIGS. 1 and 2 are plan and cross-sectional views, respectively, of a printed circuit assembly for receiving lamp sockets;

FIG. 3 is an elevational view of an LED socket assembly according to the invention;

FIG. 4 is an exploded view of the socket assembly of FIG. 3;

FIG. 5 is a rear view of the socket assembly as viewed in the direction of arrow A in FIG. 4;

FIG. 6 is an elevational view of the assembly of FIG. 3 installed in a printed circuit assembly, shown in section;

FIG. 7 is an exploded view of an LED socket assembly according to a second embodiment of the invention and FIG. 8 is a rear view of the socket assembly as viewed in the direction of arrow B in FIG. 7.

DESCRIPTION OF THE INVENTION

As is well known, printed circuit boards of the type used in automotive instrument clusters have apertures for receiving twist-in lamp sockets and conductors adjacent the apertures for electrical connection to the sockets. The printed circuit boards may be hard boards with conductors affixed to a surface, or flexible circuits with a hard board backing. The latter type is shown in FIGS. 1 and 2; a flexible printed circuit 10 lies against a rigid support 12. Both members define an aperture 14 which is circular with two opposed enlarged recesses 16. Conductive paths 18 on the flexible circuit 10 include two arcuate pads 20 on opposite sides of the aperture 14 which are connected to a lamp voltage and to ground for energizing a lamp.

A lamp socket 22 adapted to fit within the circuit assembly aperture 14 is shown in FIGS. 3, 4, and 5. The socket 22 has a cylindrical body 24 sized to fit through the circular aperture 14 of the printed circuit. The socket body has a front face 26 and a pair of radial flanges 28 adjacent the front face which fit through the recesses 16 of the printed circuit. Each flange 28 has a sloped cam surface 30 on one end, and a stop 32 extending axially along the side of the body 24. The body 24 has a rear face 33, and a pair of D-shaped base flanges 34 axially spaced from the flanges 28 extend radially from the body 24 adjacent the rear face 33. The base flanges 28 are large enough to encompass the pads 20 on the circuit and have opposed inner faces 29 adjacent and perpendicular to the rear face 33. A contact bump 36 on the front face of each flange assures secure contact with the pad 20 upon assembly to the circuit board. FIG. 6 shows the socket 22 inserted into the circuit board assembly. The flanges 28 are inserted through the apertures 16 from the pack and by twisting the socket 22 the cam surfaces 30 assist the flanges 28 to slide over edges of the board 12 and to clamp the printed circuit assembly between the flanges 28 and the base flanges 34, thereby securing the socket to the board and forcing the bumps 36 against the pads 20 on the flexible circuit 10.

The body 24 of the socket 22 has two pairs of holes 38, 40 extending from the face 26 of the socket to the rear face 33 for receiving leads from an LED 42 and a resistor 44, respectively. The LED is designated as a T-1_LED and has a pair of axial leads 46 which extend from its base and through the pair of holes 38. The resistor 44 has a cylindrical body 47 and axially extending leads 48, one of which is bent around to parallel the other. One hole of the pair 40 is sufficiently large for part of its depth to receive a portion of the resistor body 47. Each hole is connected to electrical paths arranged to connect the resistor 44 and the LED in series between a voltage and ground carried by the two circuit pads 20. The electrical paths are conductors deposited on the surface of the socket 22. A first path 50 covers one of the bumps 36, extends along the front surface of the base flange 34, across an inner face 29, and along the rear face 33 to one of the holes containing an LED lead. A second path 52 is similar to the first path but begins on the other bump 36 and terminates at a different hole servicing a resistor lead 48. A third path 54, only on the rear face 33, extends between the two remaining holes to connect the resistor and the LED. Each path terminates at a solder pad 56 which is soldered to its respective lead. Thus the resultant product is an LED and a resistor in series on a twist-in socket for easy application to a circuit board assembly. The outer socket configuration is similar to that used for incandescent lamps and thus is conveniently handled using conventional insertion equipment.

The socket 22 resembles a miniature printed circuit board since it comprises an insulating body having circuit traces applied thereto, and preferably is manufactured like a printed circuit. Many plastic bodies are molded in an array and the array is kept intact during the subsequent processing. The conductor paths are plated or otherwise deposited on the bodies using prior art plated circuit fabrication techniques. For example, a two-shot molding process defines circuit patterns of different materials, only one of which accepts plating. The LEDs 42 and the resistors 44 are inserted or stuffed into the holes provided for them using automatic insertion equipment, and the connections are completed by flow soldering. Finally the array is broken apart to separate the individual socket assemblies.

A second embodiment of the invention is illustrated in FIGS. 6 and 7. Surface mount components are used instead of components with leads which extend through the socket. The surface mount resistor 60 is a flat square chip, while the LED 62, designated as a subminiature surface mount LED, has a generally cubic base 64 supporting a rounded lens 66. Short leads 68 extend laterally from the base 64. The general configuration of the plastic molding for the socket 22' is the same as the socket 22 but the holes are different as well as the conductive paths. The front face 26' has a rectangular recess 70 to receive the base 64 of the LED 62. When the LED is seated in the recess 70, the leads 68 lie on the front face 26' of the socket to conductor paths 72 and 74. The resistor 60 is mounted on the face 26' adjacent the LED and connected to paths 74 and 76. Plated-through holes 78 and 80 are connected to paths 76 and 78 and extend from the front face 26' to the rear surface of the base flanges 34. A circuit path 82 from each bump 36 extends along the front surface of its flange 34, and around the side of the flange to the rear surface to its respective plated through hole 78 or 80. The fabrication of this device is essentially the same as the first embodiment, although solder is applied to the paths on the front face by screening or plating and reflow soldering is used to join the surface mount components to the circuit paths.

It will thus be seen that with either embodiment the LED socket assembly is easily and inexpensively made and the use of LEDs in instrument clusters is made practical, even when flexible printed circuits are used.

The embodiments of the invention in which an exclusive property or privilege is claimed are defined as follows:

1. A socket assembly for coupling a light emitting diode to a printed circuit assembly having conductive paths and an aperture adjacent conductive paths for receiving the socket comprising:
   a molded socket for insertion into the printed circuit aperture and locking to the circuit assembly in contact with the conductive paths;
   means for mounting a light emitting diode on the socket;
   conductive traces on the surface of the socket for connection to conductive paths on the printed circuit assembly and to the light emitting diode;
   a resistor mounted on the socket and connected in series with the LED by the conductive traces.

2. A socket assembly for coupling a light emitting diode to a printed circuit assembly having conductive paths and an aperture adjacent conductive paths for receiving the socket comprising:
   a molded socket for insertion into the printed circuit aperture and locking to the circuit assembly in contact with the conductive paths;
   means for mounting a light emitting diode on the socket;
   conductive traces on the surface of the socket for connection to conductive paths on the printed circuit assembly and to the light emitting diode;
   wherein the socket includes a front surface for mounting the LED and a rear surface carrying conductive traces; and
   the mounting means for the LED comprises a pair holes in the socket between the front and rear surfaces, and light emitting diode leads extending through the holes for connection to the traces on the rear surface.

3. A socket assembly as described in claim 2 wherein the assembly includes:
   a resistor mounted beside the LED;
   the socket having a second pair of holes between the front and rear surfaces, and leads extending from the resistor through the second pair of holes for connection to the traces on the rear surface; and
   the traces are arranged to couple the LED in series with the resistor.

4. A socket assembly as described in claim 3 wherein:
   the resistor has a cylindrical body;
   one hole of the second pair is large enough to accommodate the resistor body; and
   the resistor body resides in the one hole.

* * * * *